United States Patent
Aratake et al.

(12)

(10) Patent No.: US 6,996,884 B2
(45) Date of Patent: Feb. 14, 2006

(54) METHOD FOR MANUFACTURING PIEZO-ELECTRIC VIBRATOR

(75) Inventors: Kiyoshi Aratake, Tochigi (JP);
Masayoshi Shiraishi, Tochigi (JP)

(73) Assignee: Seiko Instruments Inc., Chiba (JP)

( * ) Notice: Subject to any disclaimer, the term of this patent is extended or adjusted under 35 U.S.C. 154(b) by 345 days.

(21) Appl. No.: 10/358,860

(22) Filed: Feb. 5, 2003

(65) Prior Publication Data

US 2003/0154584 A1    Aug. 21, 2003

(30) Foreign Application Priority Data

Feb. 15, 2002    (JP) .............................. 2002-038139

(51) Int. Cl.
*H04R 17/00*    (2006.01)
*H01L 41/04*    (2006.01)

(52) U.S. Cl. ........................ 29/25.35; 29/593; 29/594; 29/831; 29/847; 310/370

(58) Field of Classification Search .............. 29/25.35, 29/594, 831, 593, 847; 310/370, 367, 312, 310/363, 364

See application file for complete search history.

(56) References Cited

U.S. PATENT DOCUMENTS

| 4,172,908 | A | * | 10/1979 | Shibata et al. .............. 427/100 |
| 4,377,765 | A | * | 3/1983 | Kogure et al. .............. 310/312 |
| 4,592,663 | A | * | 6/1986 | EerNisse et al. ............ 374/117 |
| 6,237,415 | B1 | * | 5/2001 | Konno et al. ............ 73/504.16 |

\* cited by examiner

*Primary Examiner*—Carl J. Arbes
*Assistant Examiner*—Tai Nguyen
(74) *Attorney, Agent, or Firm*—Adams & Wilks

(57) ABSTRACT

In a method for manufacturing a piezo-electric vibrator, a vibrator is provided having a vibrator piece and a frame surrounding a periphery of the vibrator piece. A first exciting electrode is formed on the vibrator piece. A weight is disposed on the vibrator piece in spaced-apart relation to the first exciting electrode. A characteristic of the vibrator is then adjusted. The first exciting electrode is removed and a metal film is formed on a surface of the vibrator. The metal film is patterned and a second exciting electrode is formed on the vibrator piece.

21 Claims, 6 Drawing Sheets

PRIOR ART 130　70　121　80　81　160　50　40

METHOD FOR MANUFACTURING PIEZO-ELECTRIC VIBRATOR

BACKGROUND OF THE INVENTION

1. Field of the Invention

The present invention relates to a method for manufacturing a piezo-electric vibrator to be used in devices such as a portable telephone and a portable information terminal.

2. Description of Related Art

Conventional piezo-electric vibrators have, for example, a structure providing a lid and a base having a hollow portion having a space in which vibration of a piezo-electric vibrator piece is not disturbed at upper and lower faces of the vibrator consisting of the piezo-electric vibrator piece and a frame-shaped portion integral with the base end portion thereof.

An electrode pattern of an exciting electrode film and the like formed on the individual vibrator piece gets an electric characteristic by making the vibrator piece excite individually in the case of mass production of wafer units by forming plural members of the above piezo-electric vibrators on a wafer of large area. As a result, each of these electrode patterns need to be arranged independently.

In the foregoing conventional piezo-electric vibrator, the independent electrode patterns of the wafer forming plural vibrators is adjusted by obtaining the characteristics of the individual vibrator pieces by joining members at high temperature and applying a voltage, and putting a junction film between the members, such as an anode function. Thereafter, a spattered film is applied to the lid body in order to short each electrode pattern. Thus, all electrode patterns are connected and power is supplied to junction films of both faces of a substrate at the same time.

FIG. 1 is an exploded perspective view of each component of a lid, a vibrator, and a base constructing the conventional piezo-electric vibrator. FIG. 2 is a perspective view of the upper face of the conventional piezo-electric vibrator. FIG. 3 is a sectional view of the conventional piezo-electric vibrator.

As shown in FIG. 1, the conventional piezo-electric vibrator is a vibrator having a vibrator piece 110 of a tuning fork type consisting of a crystal ($SiO^2$), for example, and provides a vibrator 20 having the vibrator piece 110, and a lid 10 and a base 30 constituting a pair of lid bodies sealing airtightly the vibrator piece 110 in a state enabling it to vibrate by being joined by both faces of the vibrator 20. The conventional vibrator 20 has the vibrator piece 110 of tuning fork type and the frame-shaped portion 100 connected to the base end portion thereof integratedly and surrounding the periphery of the vibrator piece 110 as shown in FIG. 1, FIG. 2, and FIG. 3.

As shown in FIG. 1 and FIG. 3, the lid 10 and the base 30 being a pair of lid bodies are formed of soda lime glass and the like, for example, and have a hollow cavity 90 forming a space in which vibration of the vibrator piece 110 is not disturbed at an area corresponding to the vibrator piece 110.

In the vibrator 20 having the lid 10 and the base 30, an exiting electrode film 80 for vibrating the vibrator piece 110 and an exiting electrode film 81 having a different polarity from the exiting electrode film 80 are formed at two faces of the front and the back and sides as shown in FIG. 3. Further, joining films 40 and 41 consisting of the same material as the exiting electrode films 80 and 81 and being actual junction portions between the lid 10 and the base 30 are provided at an area corresponding to the frameshaped portion 100.

The lid 10 and the base 30 are joined to the upper and lower faces of the vibrator 20 using these joining films 40 and 41 by so-called anode junction described in detail later.

In the manufacturing process of the above conventional vibrator, plurality of vibrators 20, lids 10, and bases 30 shown in FIG. 1 are formed on a wafer using etching by photolithography. As shown in FIG. 4, the vibrators 20 are formed on a sheet of crystal wafer 130 being a first wafer. The vibrator 20 is constructed by a frame-shaped portion 100, plural vibrator pieces 11 and the like. That is, plural vibrators 20 are formed integratedly on the crystal wafer 130.

At the same time, a through-hole 121 is formed between crystal vibrator pieces 110 in a longitudinal direction of the vibrator piece 110, and an inner face of the through-hole 121 becomes a part of the side face of the vibrator 20 after cutting the crystal wafer 130.

The lid 10 and base 30 are formed on glass wafers consisting of soda lime glass, for example. Plural hollow cavities 90 are formed on these wafers through etching by photolithography corresponding to each vibrator piece 110 of the crystal wafer 130. That is, plural lids 10 are formed integratedly on a glass wafer being a second wafer, and plural bases 30 are formed integratedly on a glass wafer being a third wafer. At the same time, a through-hole larger than the through-hole 121 of the crystal wafer 130 is formed at a part corresponding to the through-hole 121 of the crystal wafer 130 being the first wafer of the third wafer, and inner face of the through-hole formed at the third glass wafer becomes a part 122 of the side face of the base 30 after cutting the glass wafer.

The exciting electrode films 80 and 81 of the upper and lower faces and side face of vibrator piece 110 of vibrator 20, joining films 40 and 41 of upper and lower faces of the frame-shaped portion 100, and an ejecting electrode 50 of the base end portion of the crystal vibration piece 110 are formed by the same spattered film formed on the whole surface of the crystal wafer 130 as shown in FIG. 4. Although Al, Cr, and alloy of these and the like are used for the material of the spattered film, Al is used for forming the spattered film in the related art. Patterning the Al spattered film by photolithography, electrodes of the exciting electrodes 80 and 81, the ejecting electrode 50, etc. and electrode patterns consisting of the joining films 40 and 41, etc. are formed at upper and lower faces of each vibrator 20.

The exciting electrode film 80 being one pole of the vibrator piece 110 is extended and connected to the joining film 40 formed at the frame-shaped portion 100, and the exciting electrode film 81 being the another pole of the vibrator piece 110 is extended and connected to the joining film 41 formed at the frame-shaped portion 100. Further the joining film 41 is extended to the surface of the opposite side of the vibrator 20 through the end portion side face 121 of short direction of the frame-shaped portion 100 at the base end portion side of the vibrator piece 110 of the vibrator 20. At least a part of the joining film 40 and the joining film 41 formed at both faces of the vibrator 20 are formed so as to surround the periphery of the hollow cavities 90 of the lid 10 and the base 30 respectively at the both sides. Thus, inside of the hollow cavities 90 is sealed airtightly after joining.

At this stage, an electrode pattern 160 of each vibrator 20 is independent as shown in FIG. 4 and it is possible to adjust a characteristic of the vibrator using the ejecting electrode 50 different from the joining film 40 in polarity. At this stage, adjustment of the frequency of the vibrator piece 110 is carried out.

FIG. 5(A) to FIG. 5(D) show a partial process of forming the piezo-electric vibrator according to the conventional art. In the method, a foreign body is adhered to the joining film 40 (or 41) during formation of the film of foundations 200 as shown in FIG. 5(B) and during laser trimming of a weight 210 when adjusting the frequency as shown in FIG. 5(D). By the existence of the foreign body, a gap generates between the lid 10 and the joining film 40, or the base 30 and the joining film 41 at an anode junction, and further a junction between the lid 10 and the joining film 40, or the base 30 and the joining film 41 is disturbed.

However, in the above method, the characteristic after the junction has a dispersion by a contaminant of the foreign body generating during forming of the film process for adjusting a frequency of the vibrator and for laser trimming.

Further, dispersion of the characteristic generates even by an electric resistance value which each short spattered film has and the generation of a level difference is caused by the short spattered film.

SUMMARY OF THE INVENTION

In view of the foregoing drawbacks in the conventional art, an object of the invention is to provide a uniform electrode structure which does not have a difference level at a junction face and which has a low resistance value.

The invention solving the above problems in the conventional art is characterized by a method of manufacturing a piezo-electric vibrator comprising the steps of providing a vibrator having a vibrator piece and a frame at a periphery of the vibrator piece, forming a first exciting electrode on the vibrator piece, forming a weight on the vibrator piece in spaced-apart relation to the first exciting electrode, adjusting a characteristic of the vibrator, pealing of f the first exciting electrode, forming a metal film at the surface of the vibrator, and patterning the metal film and forming a second exiting electrode.

Junction enable to obtain a vibrator having stable characteristic is possible by forming again the electrode pattern including the joining film and by removing contaminant stuck at the surface and disturbing junction.

DETAILED DESCRIPTION OF THE PREFERRED EMBODIMENT

A method for manufacturing a piezo-electric vibrator according to the invention is characterized by forming an external form shape of a vibrator piece and a frame at periphery of the vibrator piece, forming a first exciting electrode at the vibrator piece, forming a weight separating from the first exciting electrode at the vibrator piece, adjusting a characteristic of the vibrator, pealing off the first exciting electrode, forming a second exiting electrode.

Further, a method for manufacturing a piezo-electric vibrator according to the invention is characterized by forming plural vibrator pieces of vibrators and an external form of a frame, forming a weight and a first exciting electrode at each surface of plural vibrator pieces, forming a frame electrode separating from the first exciting electrode at the surface of each frame of the plural vibrator pieces, adjusting a characteristic of the vibrators, pealing off the first exciting electrode and the frame electrode, forming a metal film at the surface of the vibrators and the frame so as to conduct between the adjacent frames, and patterning the metal film and forming a second exiting electrode and the joining film connected electrically to the second exiting electrode.

Further, the invention is characterized in that materials and shapes of the first exciting electrode and the second exiting electrode are the same.

Thus, by reforming the exciting electrodes and joining films, it is possible to remove foreign body at joining face and to adjust a characteristic of each vibrator, and moreover resistance value between joining films decreases so as to obtain a with improved yield and characteristics.

Figure 7:
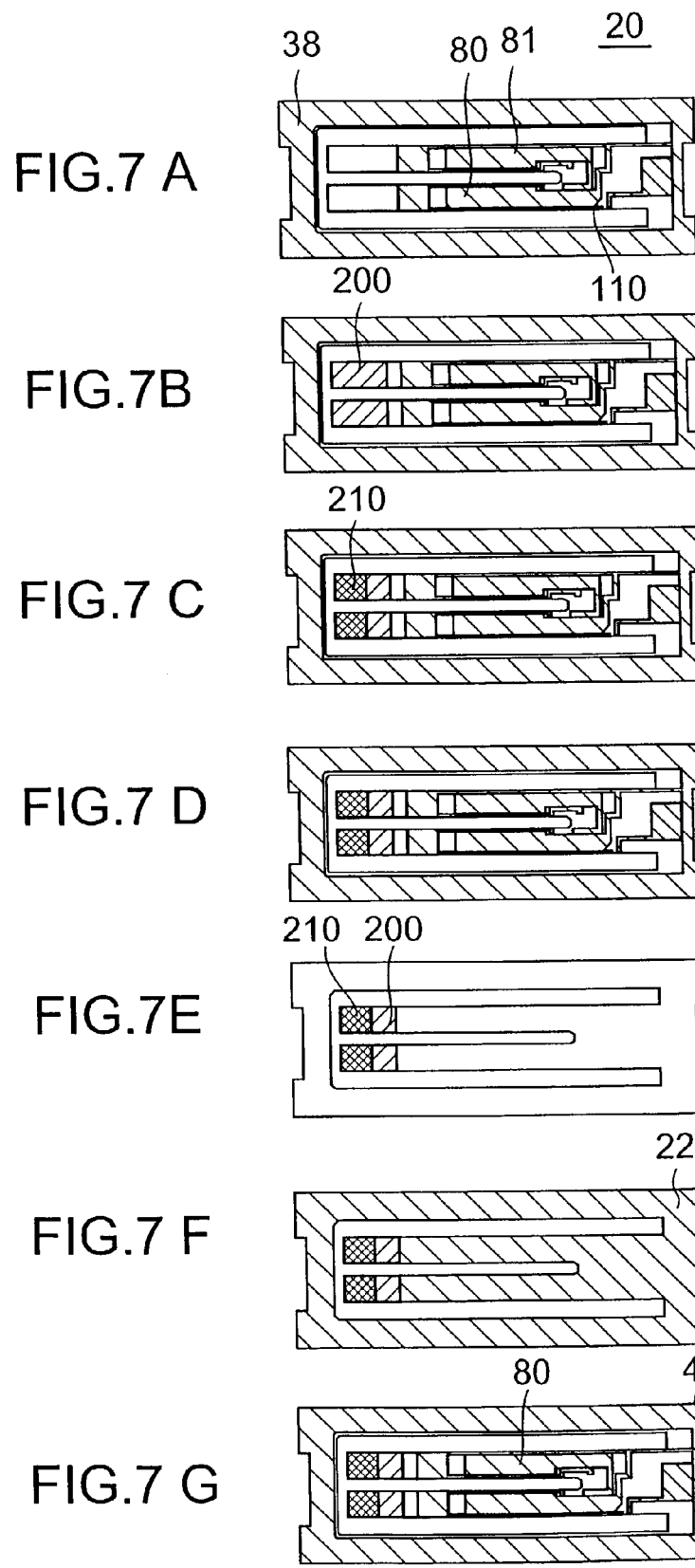
FIG. 7 is a flowchart of a process after forming an electrode of the invention.

The invention will be described referring drawings in detail below. In the invention, manufacturing is carried out by a process flow as shown in FIG. 7. A frame electrode 38 and exciting electrodes 80 and 81 are formed at a surface of a vibrator 20 as shown in FIG. 7(A). The frame electrode (not shown) is formed even at a rear face of the vibrator 20.

Next, a foundation 200 of a weight is formed at the tip end of the vibrator 20 by spattering and the like at FIG. 7(B). A weight 210 is formed at the tip end of the vibrator 20 of the foundation 200 at FIG. 7(C). The frame electrode 38 exists at the frame portion of the vibrator, and application of a voltage and excitation of the vibrator piece vibrates the vibrator 20.

Then, laser trimming is carried out to adjust the frequency and temperature characteristics of the vibrator at FIG. 7(D).

Next, the frame electrode 38 and the exciting electrodes 80 and 81 are pealed off leaving the weight 210 and the foundation 200 as shown in FIG. 7(E). A metal film 220 consisting of Al is formed on the entire face of the vibrator 20 by spattering as shown in FIG. 7(F). Finally, the metal film and the exciting electrode 80 at the surface of the vibrator piece are patterned and the joining film 40 is formed at the surface of the frame of the vibrator as shown in FIG. 7(G). Here, the joining film 40 is connected electrically to the exciting electrode 80 and works as a part of an electrode. According to this method, foreign bodies adhered to the frame electrode 38 and the exciting electrodes 80 and 81 during formation of the foundation 200 and the like and laser trimming of the weight 210 are removed during pealing of f of the frame electrode film 38 so as to form a new joining film. Thus, a gap caused by the foreign body does not appear so that a good junction is achieved.

Figure 1:
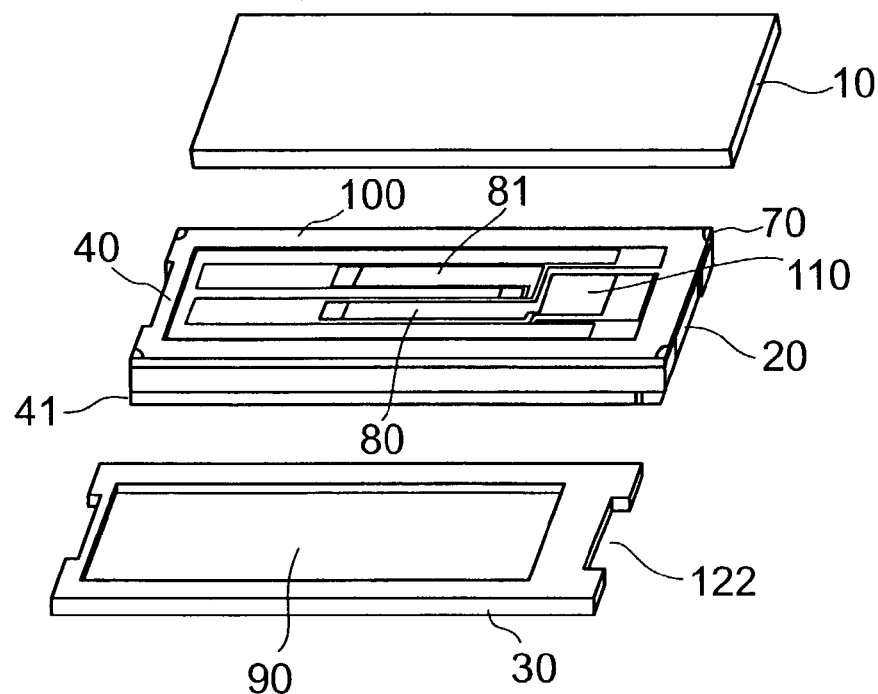
FIG. 1 is an exploded perspective view of the piezo-electric vibrator according to the related art.
Figure 2:
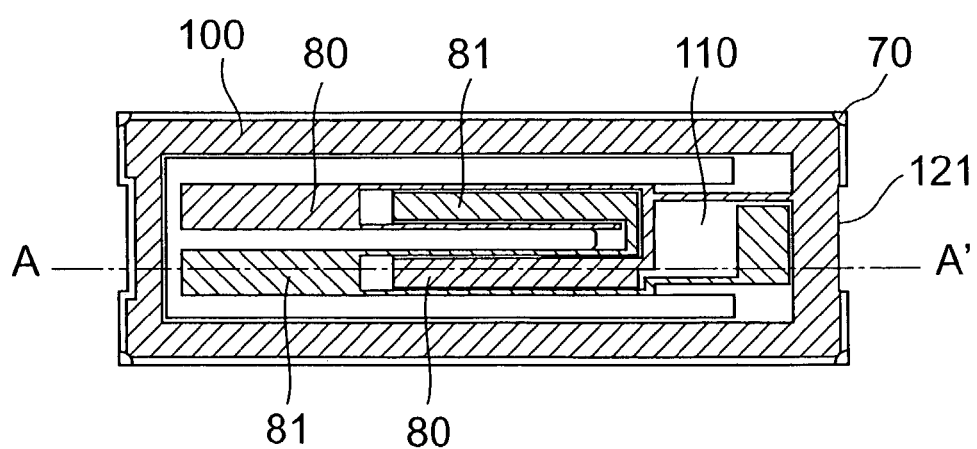
FIG. 2 is a top view of the vibrator 20 according to the related art.
Figure 3:
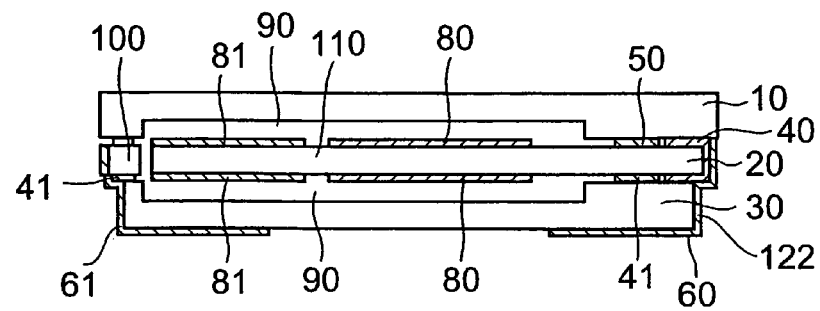
FIG. 3 is a sectional view of the piezo-electric vibrator according to the related art and the invention.
Figure 4:
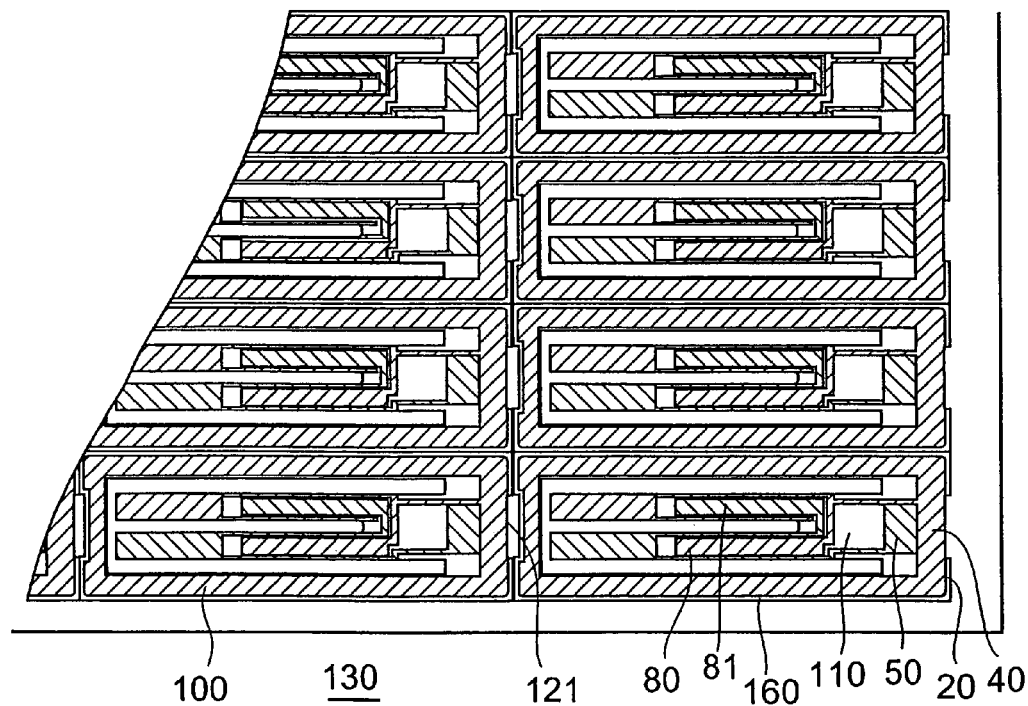
FIG. 4 is a schematic view of a crystal wafer according to the related art.
Figure 5:
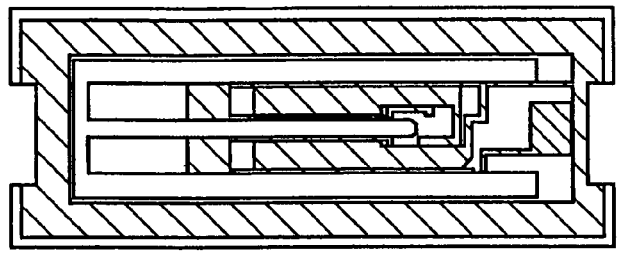
FIG. 5 shows a partial process of forming the piezo-electric vibrator according to the related art.
Figure 5:
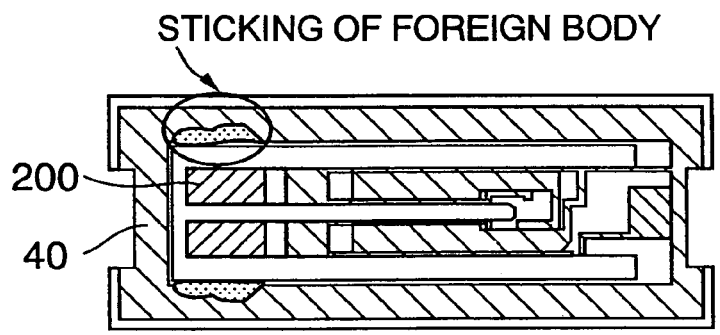
Figure 5:
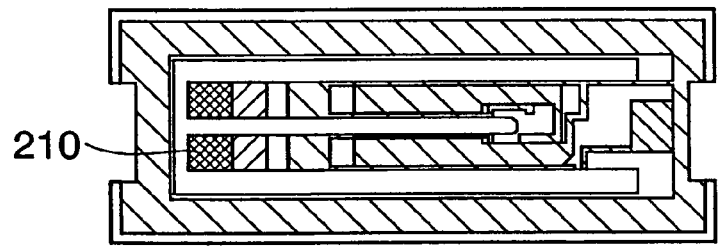
Figure 5:
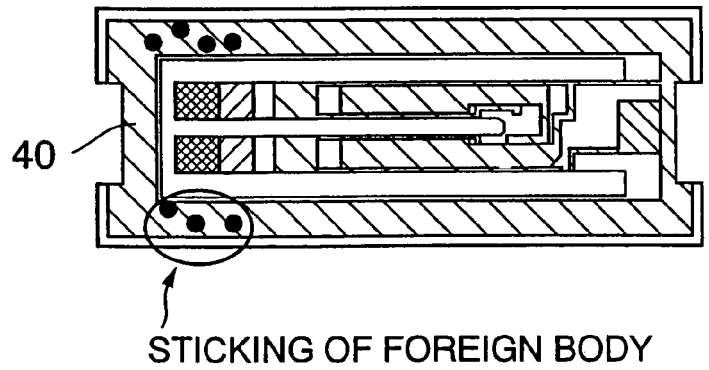
Figure 6:
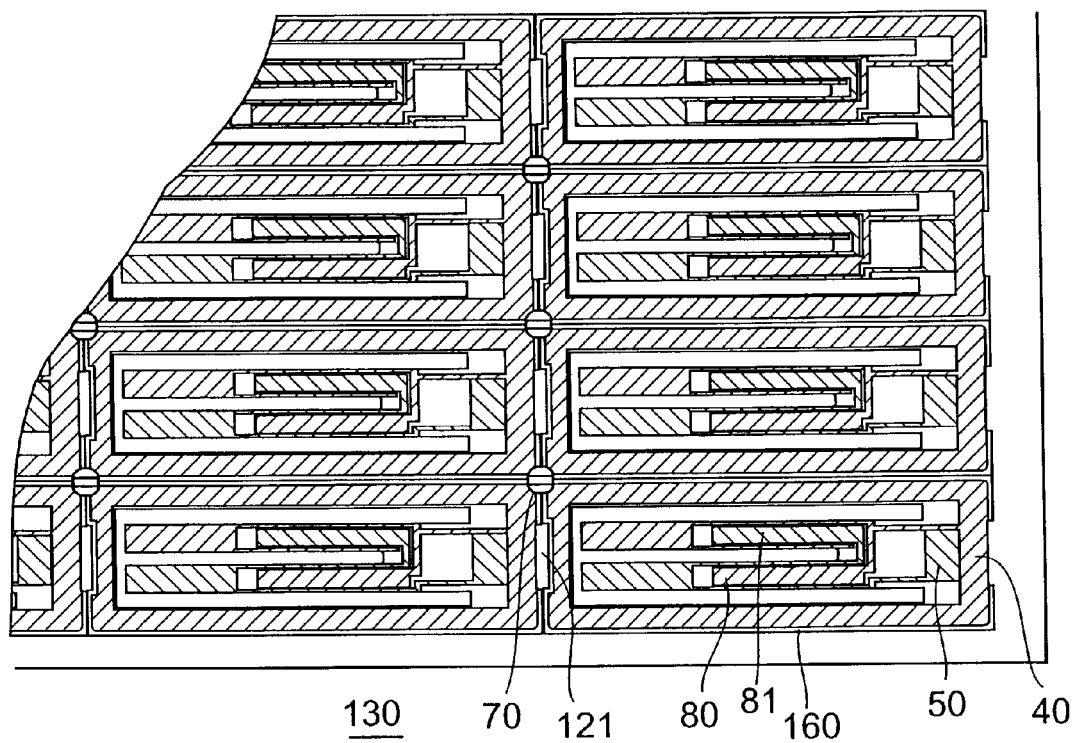
FIG. 6 is a schematic view of a crystal wafer after forming a spattered film according to the related art.
Figure 8:
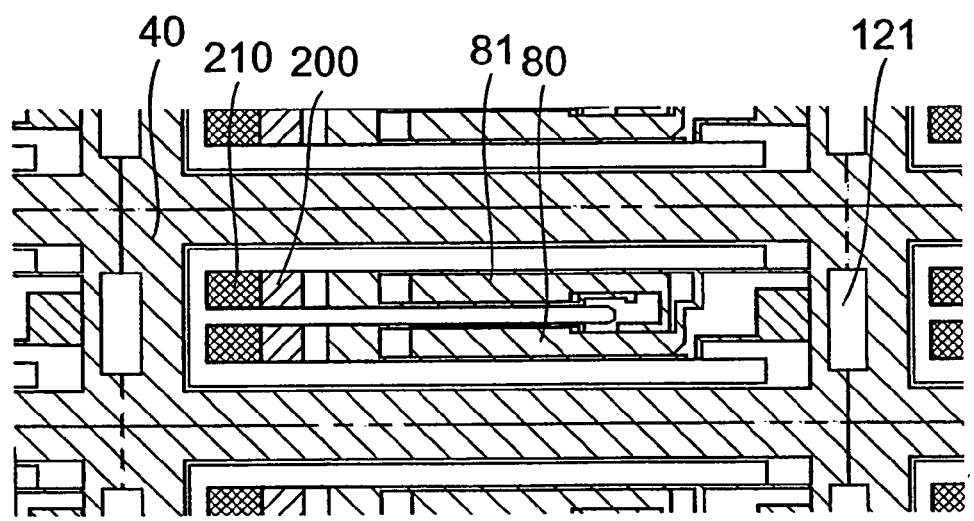
FIG. 8 is a schematic view of a crystal wafer according to an embodiment of the invention.

The joining films 40 and 41 formed individually for anode junction are shorted as shown in FIG. 6 after forming each of the vibrator 20, the lid 10, and the base 30 on the wafer in the related art. On the contrary, the joining film previously shorted is formed newly by the process as shown in FIG. 7 in the invention. Thus, a pattern as shown in FIG. 8 is obtained. Here, although the frame electrode and the exciting electrodes 80 and 81 are pealed off once as shown in FIG. 7(E), it is necessary to select material so as not to peal off the weight for adjusting frequency. In the embodiment, Al is used for the electrode film 220 and Au and Cr are used for the weight 210.

By using the joining film 40 previously shorted in such a way, an electric resistance having generated between the vibrators 20 at short spattering is removed so that the electric resistance of the joining film 40 in the wafer becomes low. Thus, there is no dispersion of resistance on the face of the wafer so that it is possible to carry out a junction which is low in voltage at the anode junction and a uniform and reliable junction.

After finishing the junction, a sectional structure of the piezo-electric vibrator achieves the structure in FIG. 8 even in the embodiment similarly as the related art. That is, after finishing the junction, leading electrodes 60 and 61 are formed on the surface of the base 30 from the base end side face of the short direction of the base 30 through an inner wall face of a through-hole 120 by forming a metal consisting of Cr, Au, etc. for example using part spattering and the like. The leading electrode 60 is provided to contact the joining film 40, and the leading electrode 61 is provided to contact the joining film 41.

Further, three sheets of wafers are joined in an integrated manner and the integrated wafers are cut mechanically at a predetermined position using a dicing saw and the like so as to provide the individual crystal vibrators.

As described above, according to the invention, a vibrator with improved yield and characteristics is achieved by forming the exciting electrode including the joining film and by removing a foreign body adhered at the surface and decreasing the resistance value between the joining films by adjusting the characteristics of each vibrator.

What is claimed is:

1. A method for manufacturing a piezo-electric vibrator, comprising the steps of:
    providing a vibrator having a vibrator piece and a frame surrounding a periphery of the vibrator piece;
    forming a first exciting electrode on the vibrator piece;
    disposing a weight on a surface of the vibrator piece in spaced-apart relation to the first exciting electrode;
    adjusting a characteristic of the vibrator;
    removing the first exciting electrode from the surface of the vibrator piece; and
    forming a second exciting electrode on the surface of the vibrator piece.

2. A method for manufacturing a piezo-electric vibrator according to claim 1; wherein the adjusting step comprises adjusting a characteristic of the vibrator by trimming the weight.

3. A method for manufacturing a piezo-electric vibrator according to claim 1; wherein the material of the metal film is Al and the material of the weight is Au and Cr.

4. A method for manufacturing a piezo-electric vibrator according to claim 1; wherein the materials and shapes of the first exciting electrode and the second exciting electrode are the same.

5. A method according to claim 1; further comprising the steps of forming a metal film on a surface of the vibrator and patterning the metal film between the steps of removing the first exciting electrode and forming the second exciting electrode.

6. A method according to claim 1; wherein the forming step includes the step of forming a frame electrode on a surface of the frame.

7. A method for manufacturing a piezo-electric vibrator, comprising the steps of:
    providing a plurality of vibrators each having a vibrator piece and a frame surrounding a periphery of the vibrator piece;
    forming a first exciting electrode on a surface of the vibrator piece of each of the vibrators;
    forming a first frame electrode on a surface of each of the frames of the vibrators so that the first frame electrodes are electrically connected to the respective first exciting electrodes and so that the first frame electrodes of adjacent vibrators are connected to one another;
    disposing a plurality of weights on the respective surfaces of the vibrator pieces in spaced-apart relation to the respective first exciting electrodes;
    adjusting a characteristic of each of the vibrators;
    removing the first exciting electrode from the surface of the vibrator piece of each of the vibrators; and
    forming a second exciting electrode on the surface of the vibrator piece of each of the vibrators and electrically connecting the second exciting electrodes to the respective first frame electrodes.

8. A method for manufacturing a piezo-electric vibrator according to claim 7; wherein the adjusting step comprises adjusting a characteristic of the vibrators by trimming the weight.

9. A method according to claim 7; further comprising the steps of forming a metal film on a surface of each of frames of the vibrators to provide electrical contact between frames of adjacent vibrators between the steps of removing the first exciting electrodes and forming the second exciting electrodes.

10. A method according to claim 7; further comprising the steps of removing the first frame electrode from the surface of each of the frames of the vibrators; and forming a second exciting electrode on the surface of the frame of each of the vibrators so that the second frame electrodes are electrically connected to the respective second exciting electrodes and so that the second frame electrodes of adjacent vibrators are connected to one another.

11. A method for manufacturing a piezo-electric vibrator, comprising the steps of:
    providing a vibrator having a vibrator piece and a frame surrounding a periphery of the vibrator piece;
    forming a first exciting electrode on a surface of the vibrator piece;
    forming a first frame electrode on a surface of the frame;
    disposing a weight on the surface of the vibrator piece in spaced-apart relation to the first exciting electrode;
    adjusting a characteristic of the vibrator;
    removing the first frame electrode from the surface of the frame; and
    forming a second frame electrode on the surface of the frame.

12. A method according to claim 11; wherein the adjusting step comprises adjusting one of a frequency and temperature characteristic of the vibrator.

13. A method according to claim 11; wherein the adjusting step comprises adjusting frequency and temperature characteristics of the vibrator.

14. A method according to claim 11; wherein the adjusting step comprises adjusting a characteristic of the vibrator by laser trimming the weight.

15. A method according to claim 11; wherein the metal film comprises a film of aluminum.

16. A method according to claim 15; wherein the metal film comprises a film of Au and Cr.

17. A method according to claim 11; wherein the metal film comprises a film of Au and Cr.

18. A method according to claim 11; wherein the removing step includes the step of removing the first exciting electrode from the surface of the vibrator piece; and further comprising the step of forming a second exciting electrode on the surface of the vibrator piece.

19. A method according to claim 18; wherein the steps of forming the first and second exciting electrodes include the steps of forming the first and second exciting electrodes using the same material and with the same shape.

20. A method according to claim 11; further comprising the steps of forming a metal film on the vibrator piece and the frame of the vibrator, patterning the metal film, and electrically connecting a joining film to the second exciting electrode.

21. A method for manufacturing a piezo-electric vibrator, comprising the steps of:
providing a plurality of vibrators each having a vibrator piece and a frame surrounding a periphery of the vibrator piece;
forming a first exciting electrode on a surface of the vibrator piece of each of the vibrators;
forming a first frame electrode on a surface of each of the frames of the vibrators so that the first frame electrodes are electrically connected to the respective first exciting electrodes and so that the first frame electrodes of adjacent vibrators are connected to one another;
disposing a plurality of weights on the respective surfaces of the vibrator pieces in spaced-apart relation to the respective first exciting electrodes;
adjusting a characteristic of each of the vibrators;
removing the first frame electrode from the surface of the frame of each of the vibrators; and
forming a second frame electrode on a surface of the frame of each of the vibrators so that the second frame electrodes are electrically connected to the respective first exciting electrodes and so that the second frame electrodes of adjacent vibrators are connected to one another.

* * * * *